(12) United States Patent
Salzman

(10) Patent No.: US 7,928,538 B2
(45) Date of Patent: Apr. 19, 2011

(54) PACKAGE-LEVEL ELECTROMAGNETIC INTERFERENCE SHIELDING

(75) Inventor: James F. Salzman, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 698 days.

(21) Appl. No.: 11/538,539

(22) Filed: Oct. 4, 2006

(65) Prior Publication Data

US 2008/0185692 A1    Aug. 7, 2008

(51) Int. Cl.
   *H01L 23/552*  (2006.01)
(52) U.S. Cl. .................................. 257/659; 257/660
(58) Field of Classification Search .............. 257/659, 257/708, 704, 660; 438/121, 127
   See application file for complete search history.

(56) References Cited

U.S. PATENT DOCUMENTS

| 5,311,059 | A | * | 5/1994 | Banerji et al. | 257/778 |
| 5,355,016 | A | * | 10/1994 | Swirbel et al. | 257/659 |
| 5,557,142 | A | | 9/1996 | Gilmore et al. | |
| 6,998,532 | B2 | * | 2/2006 | Kawamoto et al. | 174/521 |
| 7,187,060 | B2 | * | 3/2007 | Usui | 257/659 |
| 7,482,678 | B2 | * | 1/2009 | Kertesz et al. | 257/659 |
| 7,488,903 | B2 | * | 2/2009 | Kawagishi et al. | 174/385 |
| 2002/0036898 | A1 | | 3/2002 | Miyakawa et al. | |
| 2004/0012099 | A1 | | 1/2004 | Nakayama | |
| 2005/0248909 | A1 | | 11/2005 | Kikuchi et al. | |

* cited by examiner

*Primary Examiner* — S. V Clark
(74) *Attorney, Agent, or Firm* — Lawrence J. Bassuk; W. James Brady; Frederick J. Telecky, Jr.

(57) ABSTRACT

A shielded electronic package, comprising a semiconductor device, an insulating housing surrounding the semiconductor device and a metal coating on the insulating housing. The metal coating covers all but those portions of the insulating housing that are adjacent to connective structures on one or more mounting sides of the insulating housing.

10 Claims, 4 Drawing Sheets

US 7,928,538 B2

PACKAGE-LEVEL ELECTROMAGNETIC INTERFERENCE SHIELDING

TECHNICAL FIELD

The present invention is directed to individually shielded electrical packages and a method for manufacturing such packages.

BACKGROUND

Electrical devices have electronic components that can generate, or be affected by electromagnetic interference (EMI, also known as radiofrequency interference). Sometimes it is critical to attenuate EMI so that the device will comply with governmental or industry standards. To attenuate EMI, one or more of the electronic components are placed inside of metal container (e.g., a "can") that forms a Faraday shield around the component. The process of forming shielding around the electronic components is laborious and expensive. The walls of cans are formed into frames for each component by stamping or bending metal sheets. The frames are soldered to a printed circuit board (PCB), one or several electronic components are put inside of the frame, a metal top is placed over the frame, and the can is soldered shut. Because the dimensions of the can are larger than the electronic components, the can occupies more space on the PCB than the electronic components. This, in turn, may require the device to be larger than desired.

Accordingly, what is needed in the art is EMI shielding and its method of manufacture that is inexpensive and easy to implement for a variety of differently shaped and dimensioned packages.

SUMMARY

The invention provides in one embodiment a shielded electronic package comprising a semiconductor device, an insulating housing surrounding the semiconductor device and a metal coating on the insulating housing. The metal coating covers all but those portions of the insulating housing that are adjacent to connective structures on one or more mounting sides of the insulating housing.

Another embodiment is an electrical device, comprising the above-described shielded electronic package and connective structures on the mounting side, the connective structures being electrically coupled to the semiconductor device. The electrical device further includes a circuit board having conductive lines that interconnect the shielded electronic package to electronic components. The shielded electronic package is mounted to the circuit board by coupling the conductive structures to one or more of the conductive lines Still another embodiment is a method of manufacturing a shielded electronic package. The method comprises forming an insulating housing around a semiconductor device. The further includes covering the housing with a metal coating on all but those portions of the housing that are adjacent to connective structures protruding from one or more mounting sides of the housing.

DRAWINGS

Figure 1:
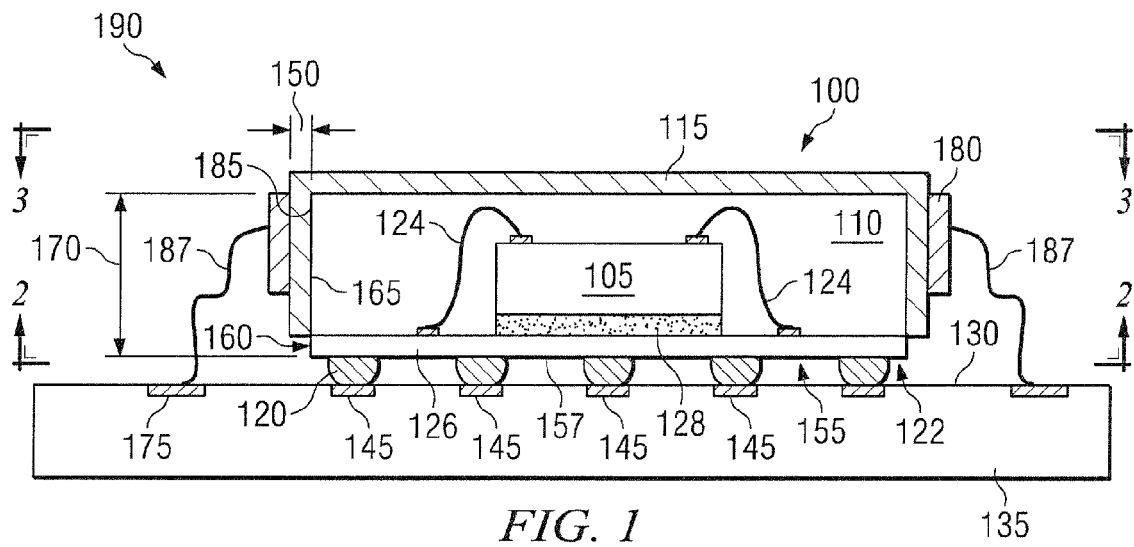
Figure 2:
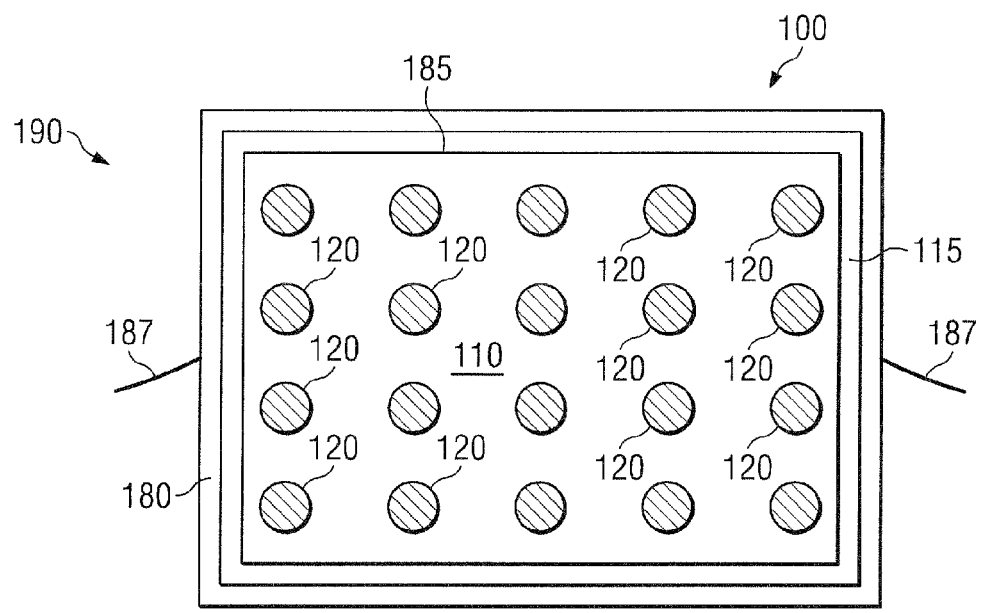
Figure 3:
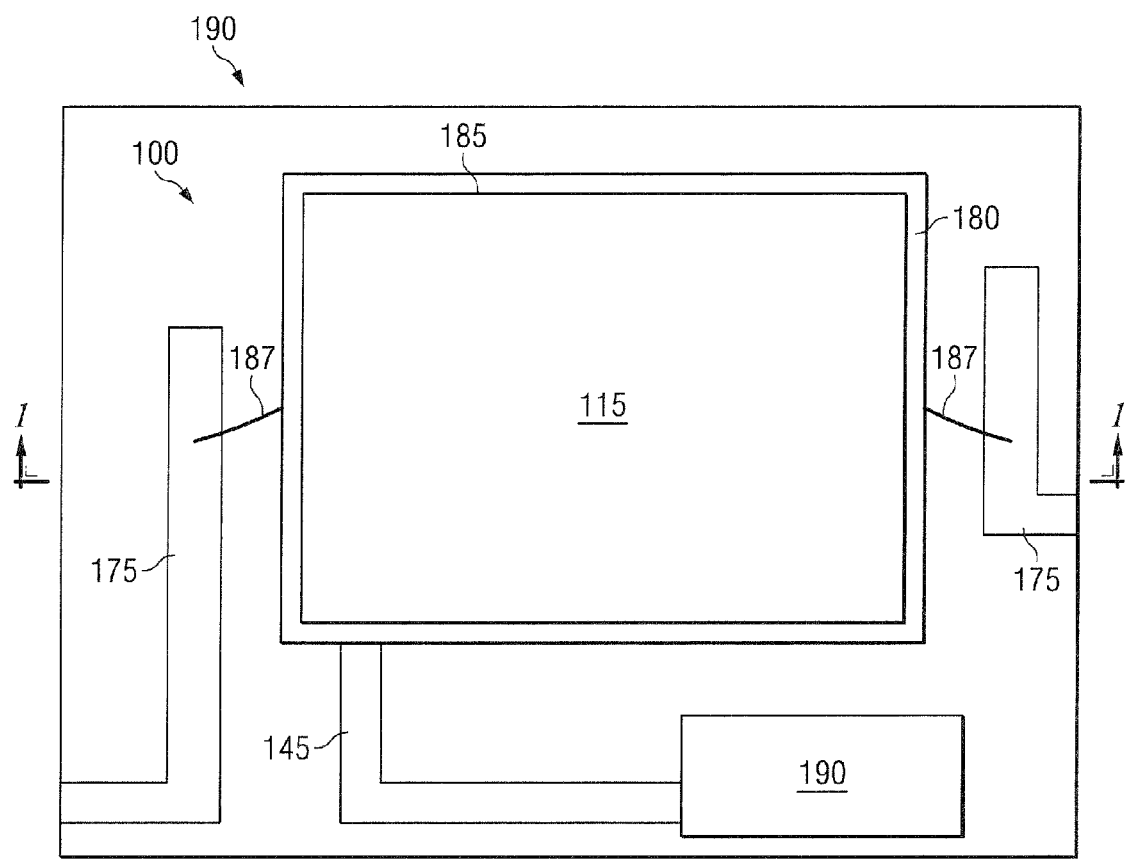
Figure 4:
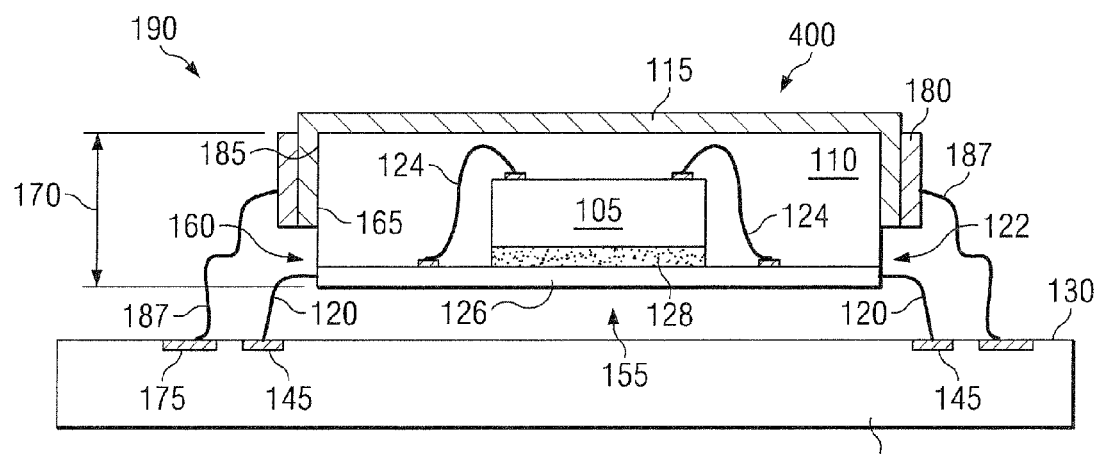

The invention is described with reference to example embodiments and to accompanying drawings, wherein:

FIG. 1 presents a cross-sectional view of an example shielded electronic package of the invention; and FIG. 2 illustrates a bottom-up plan view of the example package depicted in FIG. 1;

FIG. 3 illustrates top-down plan view of the example package depicted in FIG. 1;

FIG. 4 presents a cross-sectional view of another example shielded electronic package of the invention;

FIGS. 5-9 illustrate cross-sectional views of an example method of manufacturing a shielded electronic package of the invention.

DETAILED DESCRIPTION

FIG. 1 presents a cross-sectional view of an example shielded electronic package 100 of the invention. FIGS. 2 and 3 (using similar reference numbers) present plan views of the package 100 from the bottom-up and top-down of the package 100, corresponding to view lines 2-2 and 3-3 in FIG. 1, respectively. The cross-sectional view in FIG. 1 corresponds to view line 1-1 shown in FIG. 3.

The package 100 comprises a semiconductor device 105. The semiconductor device can be an individual or a plurality of integrated circuits, or other semiconductor devices or electrical components that are intended to work together. Examples include power amplifiers, Surface Acoustic Wave (SAW) filters, or other semiconductor devices or inductors, capacitors or other components well know to those skilled in the art. When there is more than one semiconductor device 105 in the package 100, the individual devices 105 do not generate EMI that interfere with each other's operation. However, some or all of the semiconductor devices 105 (e.g., a RF amplifier) could generate EMI that could interfere with the operation of electrical devices that are external to the package 100. Or, the operation of one or more of the semiconductor devices 105 (e.g., a receiver) inside the package 100 could be effected by EMI generated from sources outside of the package 100.

The package 100 also comprises an insulating housing 110 surrounding the semiconductor device 105. The housing 110 is made out of an insulating material, such as a ceramic or epoxy material that is, e.g., injection molded around the semiconductor device or devices 105. The housing 110 around the semiconductor device or devices 105 is typically molded into square or rectangular block.

The package 100 further includes a metal coating 115 on the insulating housing 110. By shielding the package 100 with the metal coating 115, EMI can be reduced or eliminated altogether. To maximize EMI shielding, it is desirable for the metal coating 115 to cover all but those portions of the housing 110 that are adjacent to connective structures 120 located on one or more mounting sides 122 of the housing 110.

The semiconductor device 105 can be coupled to the connective structures 120 by any number of conventional arrangements well known to those skilled in the art. E.g., as shown in FIG. 1, wire bonds 124 connect the semiconductor device 105 to a routing substrate (e.g., a lead frame) 126, which in turn, is connected to the connective structures 120. The semiconductor device 105 can be fixed to the routing substrate 124 via an adhesive 128.

In cases where when the package 100 is to be mounted to a printed circuit board (PCB) 135 the connective structures 120 are configured to couple the package 100 to a mounting surface 130 of the PCB 135. E.g., the connective structures 120 on the mounting side 122 can be bonded (e.g., via soldering) to the mounting surface 130 that comprises conductive lines 145 on the PCB 135.

The metal coating 115 is preferably bonded directly to the insulating housing 110 because this helps prevent the metal coating 115 from being removed if e.g., the package 100 is subject to mechanical forces (e.g., from handling or transport). E.g., the metal coating 115 can be formed by the physical or chemical vapor deposition of a metal or metal alloy onto housing 110. E.g., the physical vapor deposition can comprise sputtering a vapor of metal (e.g., copper or aluminum), or metal alloy (e.g., steel). The metal coating 115 preferably has a sufficient thickness 150 to cover all portions of the housing 115 to be coated. At the same time, the thickness 150 should not be overly thick so as to increase the total space occupied by the shielded package 100, or to waste materials and time spent in the formation of the metal coating 115. E.g., in some preferred embodiments, the metal coating 115 has a uniform thickness 150 of at least about 0.5 μm (±20 w) and preferably ranges from about 0.5 to 1 μm.

It is important and in some cases critical, however, that the metal coating not cover some or all of the entire mounting side of the insulating housing because the metal coating could otherwise create a short circuit between individual connective structures 120 on the mounting side 122. E.g., an uncovered portion 155 of the housing 110 can comprise substantially all of the mounting side 122 (FIG. 1).

This can be advantageous when the connective structures 120 form a closely spaced array of leadless structures that occupy substantially all of the mounting side 130. As shown in FIG. 2, the connective structures 120 are configured to form an array of leadless structures on a mounting side 122 that corresponds to a bottom horizontal side 157 of the housing 110 that is parallel to and faces the mounting surface 140 of the PCB 135. E.g., the connective structures 120 can be configured as pins to form a pin grid array (PGA), as solder balls to form a ball grid array (BGA), as pads to form a landed grid array (LGA), as a quad flat no-lead (QFN) array, on the mounting side, of other leadless structures well known to those skilled in the art.

As further illustrated in FIG. 1, it is sometimes desirable for the uncovered portion 155 to include the mounting side 122 (e.g., the bottom horizontal side 157) and a lower part 160 of one or more vertical walls 165 of the housing 110 that is closest to the mounting side 122.

The vertical walls 165 are defined as walls of the housing 110 that are substantially orthogonal (e.g., 90°±20°) to the mounting surface that the package 100 is to be mounted to (e.g., the mounting surface 140 of the PCB 135). It some cases it is desirable for the lower part 160 of all of the vertical walls 165 to not be covered with the metal coating 115 because this helps to ensure that a newly applied coating of metal will not run down the vertical walls 165 and creep onto the mounting side 122. In some cases the uncovered lower part 160 corresponds to about 10 percent of a total height 170 of the vertical walls 165. E.g., if the vertical wall 165 is about 1 mm in height, then about the lower 0.1 mm does not get coated with metal.

FIG. 4 presents a cross-sectional view of another example shielded electronic package 400 of the invention (using the same reference numbers as in FIG. 1). The package 400 is configured such that the mounting sides 122 are orthogonal to the mounting surface 130 of the PCB 135. In this example, the connective structures 120 of the package 400 are configured as wire leads (e.g., gull-wing or j-leads) that project from mounting sides 120 that includes one or more vertical walls 165 of the housing 110. E.g., connective structures 120 configured as leads can project from each of two walls 165, to form a dual-in-line lead package (FIG. 4). In other cases, the connective structures 120 configured as leads can project from each of four walls to form a quad-flat or similar package.

In such embodiments it is desirable for the uncovered portion 155 to comprise a larger lower part 160 of the vertical walls 165 so that the connective structures 120 are not shorted-circuited when the metal coating 115 is applied. In some cases the uncovered portion 155 of the vertical wall 165 is closest to the mounting surface 130 of the PCB 135 and the connective structures 120 project from the uncovered portion 155 that includes the lower part 160. E.g., the uncovered portion 155 of the lower part 160 can correspond to about 30 percent of the total height 170 of the vertical walls 165.

Preferably a conductive structure contacts both the metal coating 115 and a ground connection 175 on the PCB 135 thereby grounding the metal coating 115. It is desirable to connect the metal coating 115 to one or more ground connection 175 because this reduces EMI. E.g., when the package 100 is mounted to the PCB 135, conductive structures comprising one or more wire leads can be connected to the metal coating 115 and to one or more pads or lines configured as the ground connection 175. In certain embodiments the package 100 (or package 400) further include a conductive structure configured as a conductive gasket 180 (FIG. 1 and 4). The conductive gasket 180 surrounds an outer perimeter 185 of the metal-coated-housing 110 (FIGS. 1-4). The conductive gasket 180 is configured to contact the metal coating 115 and ground connections 175 on the PCB 135. In some embodiments it is desirable for the conductive gasket 180 to be configured as a spring gasket having spring fingers 187. The spring fingers 187 help to secure the gasket 180 to the metal-coated-housing 110 and also provide a point of attachment to the ground connections 175.

FIGS. 1, 3 and 4 also illustrates another embodiment of the invention, an electrical device 190. The electronic device 190 comprises one or more the above-described shielded electronic packages 100, 400. E.g., the package 100 can include the semiconductor device 105 (or devices) insulating housing 110 surrounding the device 105 and metal coating 115 on the housing 115 and covering the mounting side 122 of the housing 115 (FIG. 1). Connective structures 120 (e.g., leads or leadless structures) electrically coupled to the semiconductor device 105 are on the mounting side 122. The electrical device 190 further includes a circuit board 135 having comprises conductive lines 145 that interconnect the package to electronic components 195.

The package 100 is mounted to the circuit board 135 by coupling the connective structures 120 to one or more of the conductive lines 145. E.g., package 100 further including a conductive spring gasket 180 surrounding the outer perimeter 185 of the metal-coated-housing 110. The conductive spring gasket 180 can be configured to contact the metal coating 115 and one or more ground connections 175 on circuit board 135.

The term electronic component 195 as used herein refers to one or more of the parts of the electrical device 190 that can generate EMI or whose operation can be effected by EMI. Each electronic component 195 can include one or more integrated circuits configured to control the device power management, performs GPS functions, serve as memory storage, or perform other functions. The electronic components 195 also include one or more RF devices (radio transceiver, digital base band modem) power amplifiers, SAW filter, crystal oscillators, switches, antennas, voltage regulators, or battery monitors, or other components well know to those skilled in the art. Each of these electronic components 195 can be an individual shielded electronic package.

Some preferred embodiments of the electrical device 100 are configured as an electrical communication device configured to send and receive radiofrequency signals. The electrical communication device can send or receive the radiofrequency signals through wires or wirelessly. Examples include cellular phone, pagers, Global Positioning System (GPS) locators, moving picture expert group audio layer-3 (MP3) players, or radio or television receivers.

Another aspect of the invention is a method of manufacturing a shielded electronic package. FIGS. 5-9 illustrate cross-sectional views of selected steps in an example method of manufacturing a shielded electronic package 500 of the invention. Any of the embodiments of the packages discussed in the context of FIGS. 1-4 can be manufactured by the method.

Figure 5:
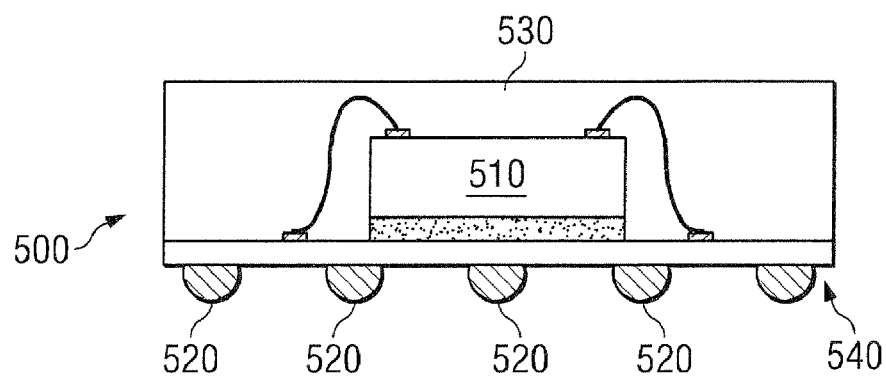

FIG. 5 shows the package 500 after manufacturing a semiconductor device 510. Those skilled in the art would familiar with the procedures used to form semiconductor devices. E.g., conventional procedures can be used to fabricate device comprising an integrated circuit (IC) in a semiconductor wafer and then dicing to wafer to form individual IC dies. Forming the device 510 can including coupling connective structures 520 (e.g., leads or leadless structures) to the IC die such as illustrated and discussed above in the context of FIG. 1 or 4.

FIG. 5 further shows the package 500 after forming an insulating housing 530 around the semiconductor device 510. E.g., the semiconductor device 510 can be placed in a mold and an insulating material, such as ceramic or epoxy, can be injected into the mold and allowed to solidify. Preferably, the housing 530 is formed such that the connective structures 520 connected to the semiconductor device 510 protrude from one or more mounting sides 540 of the housing 530.

Figure 6:
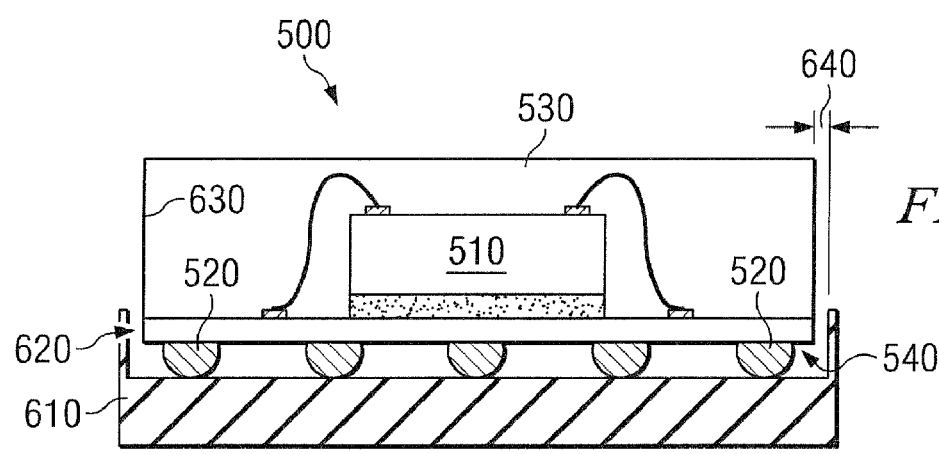
Figure 7:
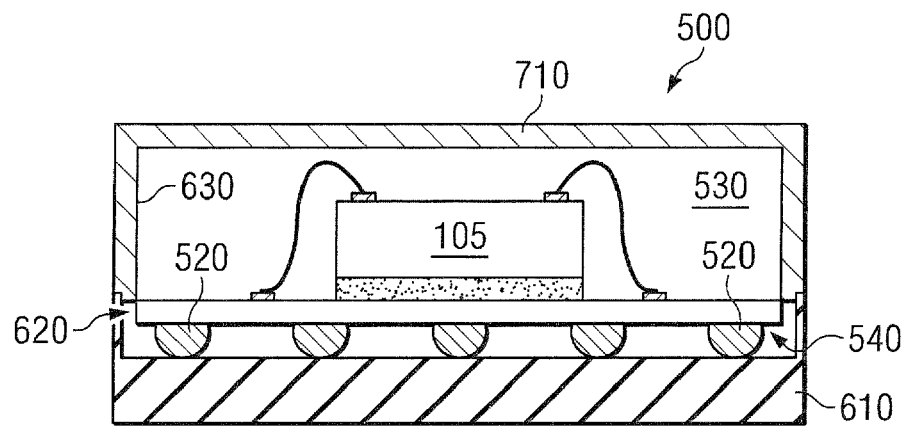

FIGS. 6-7 show selected steps in covering the insulating housing 530 with a metal coating. FIG. 6 shows the package 500 after placing the housing 530 in a tub 610. The housing 530 is placed in the tub 610 before applying the metal coating. The tub 610 is configured to surround the mounting side 540. In some cases, as shown in FIG. 6, the tub 610 can also surround a lower part 620 of a vertical wall 630 of the housing 530. It is advantageous to configure the tub 610 so that the housing 530 fits into it with little to no clearance, because this reduces the opportunity for a metal coating to contact the mounting side 540 and form a short-circuit. E.g., in some cases, a gap 640 between vertical walls 630 of the housing 530 and the tub 610 is about 2 mm or less.

FIG. 7 shows the package 500 after covering the housing 530 with a metal coating 710. Covering with the metal coating includes covering all but those portions of the housing 530 that are adjacent to the connective structures 520 that protrude from the mounting side 540. E.g., covering with the metal coating 710 can includes sputtering a metal such as described in the context of FIG. 1, onto the housing 530. As illustrated in FIG. 7, by surrounding the mounting side 540 the tub 610 prevents the mounting side 540 from being covered with the metal coating 710. After the metal coating 710 has dried the package 500 can be removed from the tub 610. Although FIGS. 6-7 depict a single package 500 and tub 610, in some preferred embodiments, each one of a plurality of packages 500 are in a plurality of tubs 610 used in a batch process to cover the housing 530 with the metal coating 710.

Figure 8:
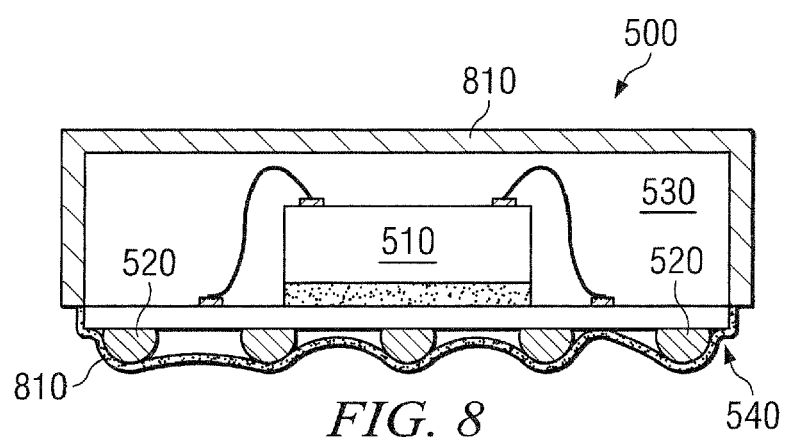

Selectively covering portions of the housing 530 need not require the use of a tub, however. For instance, as depicted in FIG. 8, a tape 810 (comprising e.g., a polyester such as MYLAR®) can be placed on those portions of the housing not to be covered (e.g., the mounting side 540). After the metal coating 820 is sprayed on the housing 530 and has dried, the tape 810 can be removed.

Figure 9:
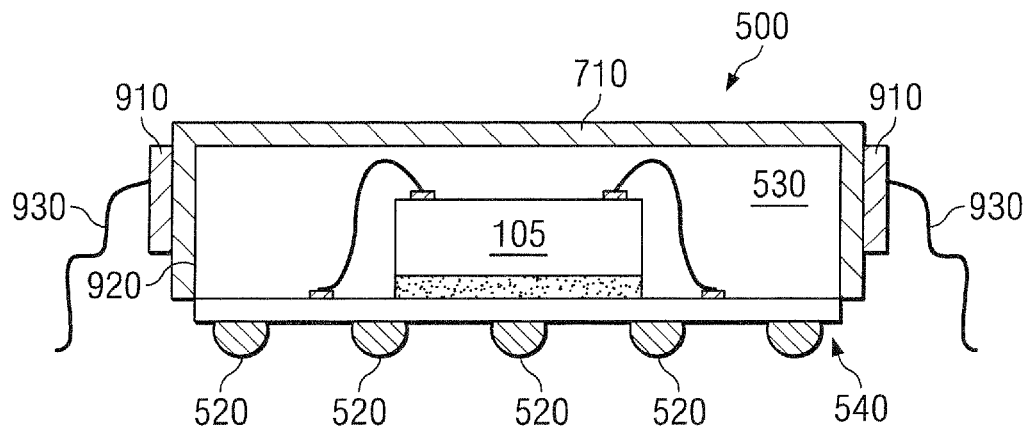

After covering the housing 530 with the metal coating 710 (or the coating 810 shown in FIG. 8) the package 500 can bemounted to a PCB. Mounting can be achieved by soldering or otherwise bonding the connective structures 530 to conductive lines or pads on a mounting surface of the PCB as discussed above in the context of FIGS. 1-4). However, in some cases, it is desirable for the package 500 to further include a structure to facilitate mounting. FIG. 9 shows the package 500 after attaching a conductive gasket 910 around an outer perimeter 920 of the metal-coated housing 530. In some cases the gasket 910 has spring fingers 930 that help to hold the gasket 910 tightly around the housing 530. As discussed in the context of FIG. 1, the gasket 910 can be configured to contact one or more ground connections on a PCB.

Although the present invention has been described in detail, those skilled in the art should understand that they could make various changes, substitutions and alterations herein without departing from the scope of the invention in its broadest form.

The invention claimed is:

1. A shielded electronic package, comprising:
   A. a routing substrate having a top surface with a peripheral margin, a certain thickness, a bottom surface, and peripheral margin surfaces extending between the top surface and the bottom surface;
   B. a semiconductor device attached to the top surface of the routing substrate and having wire bonds electrically connecting the semiconductor device with the routing substrate;
   C. an insulating housing formed on only all of the top surface of the routing substrate and surrounding the semiconductor device and bond wires, the insulating housing having a top surface and side surfaces; and
   D. a metal coating formed on only all of the top surface and side surfaces of the insulating housing, the metal coating being bonded on the insulating housing, is a metal or metal alloy, and has a thickness of between 0.5 to 1.0 μm.

2. The package of claim 1 in which the metal coating leaves the peripheral margin surfaces of the routing substrate free of any metal coating.

3. The package of claim 1 in which the routing substrate includes wire leads extending from the peripheral margin surfaces.

4. The package of claim 1 including a conductive gasket extending around the side surfaces of the insulating housing on the outside of the metal coating, and spring fingers extending from the conductive gasket for connection to circuit ground.

5. The package of claim 1 in which the routing substrate includes connective structures on its bottom surface.

6. A shielded electronic package, comprising:
   A. a routing substrate having a top surface with a peripheral edge, a certain thickness, a bottom surface, and side surfaces extending between the top surface and the bottom surface, the routing substrate including connective structures extending from at least one of the side surfaces and the bottom surface;
   B. a semiconductor device attached to the top surface of the routing substrate and having wire bonds electrically connecting the semiconductor device with the routing substrate;
   C. a solid insulating housing formed directly on the top surface of the routing substrate and surrounding the semiconductor device and bond wires, the insulating housing having an exterior top surface and exterior side surfaces, the exterior side surfaces having a bottom, exterior peripheral edge formed at the peripheral edge of the top surface of the routing substrate; and
   D. a metal coating bonded to the insulating housing, the metal coating having a top wall bonded to the top surface of the insulating housing and side walls bonded to the side surfaces of the insulating housing, all of the side walls having a bottom surface formed no lower than the peripheral edge of the top surface of the routing substrate to leave the side surfaces of the routing substrate free of the metal coating.

7. The package of claim 6 in which the routing substrate includes wire leads extending from the side surfaces.

8. The package of claim 6 in which the routing substrate includes connective structures on its bottom surface.

9. The package of claim 6 including a conductive gasket extending around the side walls of the metal coating, and spring fingers extending from the conductive gasket for connection to circuit ground.

10. The package of claim 6 in which the metal coating has a thickness of between 0.5 to 1.0 µm.

* * * * *